(12) United States Patent
Huber Lindenberger et al.

(10) Patent No.: US 10,948,553 B2
(45) Date of Patent: Mar. 16, 2021

(54) MAGNETIC SENSOR SENSITIVITY MATCHING CALIBRATION

(71) Applicant: Melexis Technologies NV, Tessenderlo (BE)

(72) Inventors: Samuel Huber Lindenberger, Jenaz (CH); Javier Bilbao De Mendizabal, Zurich (CH)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 157 days.

(21) Appl. No.: 16/153,967

(22) Filed: Oct. 8, 2018

(65) Prior Publication Data

US 2019/0107585 A1 Apr. 11, 2019

(30) Foreign Application Priority Data

Oct. 6, 2017 (EP) ..................................... 17195165

(51) Int. Cl.
*G01R 33/07* (2006.01)
*G01R 33/00* (2006.01)
(Continued)

(52) U.S. Cl.
CPC ............. *G01R 33/07* (2013.01); *G01D 5/142* (2013.01); *G01R 33/0017* (2013.01);
(Continued)

(58) Field of Classification Search
CPC .... G01R 1/00; G06F 1/00; G06N 3/00; H01L 21/00; G01D 1/00
See application file for complete search history.

(56) References Cited

U.S. PATENT DOCUMENTS 5,831,431 A 11/1998 Gottfried-Gottfried et al.
6,404,192 B1 6/2002 Chiesi et al.
(Continued)

FOREIGN PATENT DOCUMENTS

EP 1407945 A2 4/2004
EP 1637898 A1 3/2006
WO 2006067100 A1 6/2006

OTHER PUBLICATIONS

European Search Report from EP Application No. EP 17195165, dated Mar. 22, 2018.
(Continued)

*Primary Examiner* — Jermele M Hollington
*Assistant Examiner* — Temilade S Rhodes-Vivour
(74) *Attorney, Agent, or Firm* — Workman Nydegger

(57) ABSTRACT

A magnetic sensor device comprises a substrate, first and second magnetic sensors, and one or more inductors are disposed over the substrate and are controlled by a magnetic sensor controller having a control circuit. The control circuit controls the first magnetic sensor to measure a first magnetic field and the second magnetic sensor to measure a second magnetic field under presence of a fifth magnetic field generated by the inductors. The control circuit controls the first magnetic sensor to measure a third magnetic field and the second magnetic sensor to measure a fourth magnetic field under presence of a sixth magnetic field generated by the inductors, the fifth magnetic field and the sixth magnetic field being different. The control circuit calculates a relative sensitivity matching value converting magnetic field values measured by the second magnetic sensor to a comparable magnetic field value measured by the first magnetic sensor.

15 Claims, 8 Drawing Sheets

(51) Int. Cl.
*G01D 5/14* (2006.01)
*G01V 3/10* (2006.01)

(52) U.S. Cl.
CPC ....... *G01R 33/0035* (2013.01); *G01R 33/075* (2013.01); *G01V 3/104* (2013.01)

(56) References Cited

U.S. PATENT DOCUMENTS

| | | | |
|---|---|---|---|
| 6,545,462 B2 | 4/2003 | Schott et al. | |
| 7,259,550 B2 | 8/2007 | Bergsma | |
| 7,622,367 B1 | 11/2009 | Nuzzo et al. | |
| 7,835,879 B2 | 11/2010 | Vocali et al. | |
| 8,089,276 B2 | 1/2012 | Kentsch | |
| 8,102,175 B2 * | 1/2012 | Rossler | G01R 33/07 324/252 |
| 8,240,186 B2 | 8/2012 | Dunne | |
| 8,506,867 B2 | 8/2013 | Menard | |
| 8,669,761 B2 | 3/2014 | Van Veldhoven et al. | |
| 8,722,458 B2 | 5/2014 | Rogers et al. | |
| 8,825,426 B2 | 9/2014 | Chowdhary et al. | |
| 8,889,485 B2 | 11/2014 | Bower | |
| 8,963,536 B2 * | 2/2015 | Ausserlechner | G01R 33/072 324/117 R |
| 9,520,537 B2 | 12/2016 | Bower et al. | |
| 9,547,050 B2 | 1/2017 | Sartee et al. | |
| 9,678,577 B1 * | 6/2017 | Rutledge | H03K 17/97 |
| 2004/0135573 A1 | 7/2004 | Kaltenbach et al. | |
| 2008/0224695 A1 | 9/2008 | Leroy et al. | |
| 2009/0072815 A1 | 3/2009 | Kahlman et al. | |
| 2011/0031960 A1 | 2/2011 | Hohe et al. | |
| 2013/0057256 A1 | 3/2013 | Ernst et al. | |
| 2014/0033696 A1 | 2/2014 | Thoms | |
| 2015/0022192 A1 * | 1/2015 | Ausserlechner | G01R 33/022 324/207.25 |
| 2015/0022198 A1 * | 1/2015 | David | G01R 33/093 324/251 |
| 2015/0316638 A1 | 11/2015 | Yamashita et al. | |
| 2016/0093600 A1 | 3/2016 | Bower et al. | |
| 2017/0016965 A1 | 1/2017 | Chaware et al. | |
| 2017/0336481 A1 * | 11/2017 | Latham | G01R 35/005 |

OTHER PUBLICATIONS

Cok et al., "AMOLED Displays with Transfer-Printed Integrated Circuits," Journal of SID, vol. 19, No. 4, 2011, pp. 335-341.

* cited by examiner

MAGNETIC SENSOR SENSITIVITY MATCHING CALIBRATION

FIELD OF THE INVENTION

The present invention relates to integrated magnetic sensor calibration.

BACKGROUND OF THE INVENTION

Sensors are widely used in electronic devices to measure attributes of the environment and report a measured sensor value. In particular, magnetic sensors are used to measure magnetic fields, for example in transportation systems such as automobiles or in portable electronic devices. Magnetic sensors can incorporate Hall effect sensors that generate an output voltage proportional to an applied magnetic field or magneto-resistive materials whose electrical resistance changes in response to an external magnetic field. Magneto-inductive and fluxgate magnetic sensors are also used. For example, U.S. Pat. No. 6,545,462 describes a sensor for the detection of the direction of a magnetic field having magnetic flux concentrators and Hall elements. The Hall elements are arranged in the area of the edge of the magnetic field concentrator.

Other magnetic systems are integrated with an electrically conductive coil, for example a wire wrapped in a helix forming a solenoid. By applying an electrical current to the solenoid, a magnetic field is formed that can be detected by a magnetic sensor. Various solenoids can have different materials within the helix, for example an air core or a ferromagnetic core such as iron. Other designs use magnets to provide a field.

U.S. Pat. No. 5,831,431 illustrates a miniaturized coil arrangement for the detection of magnetically permeable materials. In this design, a core is provided in or parallel to a plane of the substrate and a coil wound around a section of the core so that at least a portion of the coil extends out of the substrate plane. In contrast, U.S. Pat. No. 6,404,192 discloses an integrated planar magnetic sensor with an excitation coil formed in a planar winding made using integrated circuit techniques on a semiconductor substrate. Flat detection coils are provided in different arrangements. U.S. Patent Publication No. 2015/0316638 also describes a planar coil. WO2006067100 describes a magneto-resistive sensor with a modulation magnetic field. EP1407945 describes a magnetic sensor system with a magnetic sensor and two magnets that provide a magnetic field to the sensor to overcome stray external magnetic fields.

Measurements from magnetic sensors can drift over time, providing varying sensor measurements even when exposed to the same magnetic field. For example, the magnetic field measurements can be offset from a desired nominal value, the sensitivity can vary so that measurements are a multiple (either greater or less than one) of the desired value, or both. These changes in magnetic sensor response can have a variety of causes, including changes in environmental operating conditions such as temperature or humidity, changes in the magnetic sensor materials including magnetically permeable materials due to aging, parasitic effects such as ambient temperature variation, or mechanical stress on the magnetic sensor or a package in which the magnetic sensor is mounted. It is important, therefore, to calibrate a magnetic sensor to provide accurate measurement results when the magnetic sensor is first put into use and also during operation, for example periodically or when the magnetic sensor is turned on and used. Furthermore, stray external ambient magnetic fields can be present during calibration or in operation, complicating the process of accurately measuring a desired magnetic field. Moreover, due to manufacturing process and materials variation, as well as materials and operational aging, different magnetic sensors can have different performances and sensitivities to magnetic fields so that measurements of identical magnetic fields can result in different measured values.

Thus, in general and prior to their use, magnetic sensors are calibrated so as to eliminate or at least reduce any imprecision, measurement inaccuracy, or disturbances such as process dispersions during manufacture, magnetic interference caused by the circuitry that controls the magnetic sensor, interference due to external causes (e.g., loudspeakers, batteries, ferromagnetic elements), and dependence upon temperature or time. Calibration generally consists in selecting an appropriate set of gain and offset values for each detection axis of a magnetometer, such as a tri-axis position sensor. The calibration methods are typically carried out at manufacture or else at installation of the device in an apparatus in which it is to be used (for example, in the navigation system of an automobile).

Various magnetic sensor calibration methods are known and rely on the calibration of the absolute sensitivity of the magnetic sensor, that is, the response of the magnetic sensor to an imposed external magnetic field, for example a magnetic field made by an integrated solenoid. Calibration can be accomplished using a continuous gain calibration loop such as an electronic amplifier whose gain is set to match a desired value in response to the known external magnetic field. Some calibration methods rely on physically moving the sensors and making a set of measurements to calibrate the device. For example, U.S. Pat. No. 8,240,186 describes techniques for the calibration of magnetic sensors by using one or more magnetic sensors to sample at least four data points taken as the sensors are rotated about an axis and performing a mathematical operation to obtain offset values for the measured values and correcting the measured field values with the offset values to calibrate the apparatus. The magnetic sensors can be spatially separated and controlled by a controller. U.S. Pat. No. 7,835,879 finds multiple solution sets and selects from among the solutions. U.S. Pat. No. 8,825,426 uses motion during operation to make different magnetic field measurements and fits the measured data points to an ellipsoid to calculate a magnetic field. U.S. Patent Application Publication No. 2014033696 also employs an ellipsoidal model.

Another approach to providing sensor motion for calibration uses a generated magnetic field, for example employing a magnet as described in U.S. Pat. No. 7,259,550 in which a magnetic calibration device includes at least one magnetic sensor, for example a Hall sensor, to be calibrated. At least one coil card is detachably attached and comprises three coils arranged substantially orthogonal to each other. A magnet generates a substantially homogeneous and constant calibration magnetic field and a rotator rotates the cards in the calibration magnetic field around two substantial orthogonal axes. U.S. Patent Application Publication No. 20090072815 describes a magnetic sensor device including at least one magnetic excitation field generator for generating a magnetic excitation field and at least one magnetic calibration field generator for generating a magnetic calibration field. At least one magnetic sensor element measures the magnetic reaction fields generated by magnetic particles in reaction to the magnetic excitation field and/or the magnetic calibration field. The measurements are evaluated to calibrate the magnetic sensor element.

Another magnetic sensor design incorporating magnetic-field-generating circuits is disclosed in U.S. Pat. No. 9,547,050 in which a sensor system carried by an electronic device is configured to detect an eternal magnetic field emitted by a magnetic source. The sensor system comprises a single substrate formed of non-magnetic material and having a first surface and a second surface displaced from the first surface, a first magnetic sensor at the first surface and a second magnetic sensor at the second surface, both detecting the external magnetic field at different locations. The first magnetic sensor and the second magnetic sensor concurrently (i) detect the external magnetic field and (ii) provide a first detection signal and a second detection signal, respectively. The first detection signal corresponds to a first magnetic field strength and the second detection signal corresponds to a second magnetic field strength. A processing circuit is coupled to the first magnetic sensor and the second magnetic sensor. The processing circuit uses a difference between the first detection signal and the second detection signal to provide a direction of the external magnetic field.

U.S. Pat. No. 8,089,276 discloses a magnetic field sensor assembly with at least one magnetic field sensor integrated into a semiconductor chip and has at least one magnetic field source. The semiconductor chip and the at least one magnetic field source are arranged relative to each other in such a way that a magnetic field generated by the magnetic field source is detectable with the aid of at least one magnetic field sensor.

U.S. Pat. No. 8,669,761 describes a sensor circuit configured and operated in the presence of interference. In connection with various example embodiments, a stray magnetic field is sensed with current sensors that also respectively sense current-induced magnetic fields generated by current flowing in opposing directions through different portions of a conductor. The current-induced magnetic fields and the stray magnetic field are coplanar, and the current sensors are arranged such that a portion of the output from each current sensor corresponding to the stray magnetic field is canceled when the sensor outputs are combined.

These magnetic sensors are typically calibrated using absolute sensitivity so that they sin/ply correct for a measured bias, for example using integrated coils and a continuous gain calibration loop and as described in the above references. However, this method has drawbacks that limit effectiveness, for example the magnetic field from integrated coils is relatively low, inhibiting the magnetic sensor's ability to overcome external stray magnetic fields, and the calibration is only as accurate as the current source used to generate the current passed through the integrated solenoid coil. These drawbacks lead to inaccurate magnetic sensor calibration.

There is an ongoing need, therefore, for effective calibration methods and structures for magnetic sensors operable under a wide range of measurement conditions for detecting a wide range of magnetic fields in different locations.

SUMMARY OF THE INVENTION

Embodiments of the present invention provide a magnetic sensor device including a substrate having a surface, a first magnetic sensor A for detecting a magnetic field disposed at a first location on, over, or in direct contact with the surface, a second magnetic sensor B for detecting a magnetic field disposed at a second location different from the first location on, over, or in direct contact with the surface, and one or more inductors disposed over the substrate surface and located to provide a magnetic field to the first magnetic sensor A and to the second magnetic sensor B. A magnetic sensor controller has a control circuit for controlling the first magnetic sensor A, the second magnetic sensor B, and the one or more inductors. The control circuit controls the first magnetic sensor A to measure a first magnetic field A1 and the second magnetic sensor B to measure a second magnetic field B1 while the one or more inductors are controlled to provide no magnetic field (fifth magnetic field). The control circuit controls the first magnetic sensor A to measure a third magnetic field A2 and the second magnetic sensor B to measure a fourth magnetic field B2 while the one or more inductors are controlled to provide an inductor-induced magnetic field (sixth magnetic field). The control circuit calculates a relative sensitivity matching value S that converts magnetic field values measured by the first magnetic sensor A to a comparable magnetic field value measured by the second magnetic sensor B or converts magnetic field values measured by the second magnetic sensor B to a comparable magnetic field value measured by the first magnetic sensor A. In particular embodiments of the present invention, the invention not being limited thereto, the control circuit may for instance calculate a ratio of difference values between first and third magnetic field and second and fourth magnetic field, i.e. the value $((A1-A2)/(B1-B2))$, to produce the relative sensitivity matching value S. In an embodiment, the inductor is a magnetic field source, a coil, a solenoid, or a straight conductor.

In an embodiment, the control circuit includes circuitry that can control the first magnetic sensor A to measure the ambient magnetic field, control the second magnetic sensor B to measure the ambient magnetic field, and combine the two measurements to form a magnetic field measurement. The control circuit can control the one or more inductors to provide no magnetic field during the measurements or can control the one or more inductors to provide a magnetic field during the measurements. The control circuit can control the first magnetic sensor A to measure the ambient magnetic field at the same time that the control circuit controls the second magnetic sensor B to measure the ambient magnetic field.

In another embodiment, the control circuit includes circuitry that controls the one or more inductors to provide a magnetic field having a forward polarity and controls the first magnetic sensor A to measure the ambient magnetic field including the forward polarity magnetic field, controls the one or more inductors to provide a magnetic field having a reverse polarity and controls the first magnetic sensor A to measure the ambient magnetic field including the reverse polarity magnetic field, and then calculates the ambient magnetic field excluding any field provided by the one or more inductors by combining the two measurements, for example computing a difference or sum between the two measurements. Alternatively, the control circuit includes circuitry that controls the one or more inductors to provide a magnetic field having a forward polarity and controls the first magnetic sensor A to measure the ambient magnetic field including the forward polarity magnetic field, controls the one or more inductors to provide a magnetic field having a reverse polarity and controls the second magnetic sensor B to measure the ambient magnetic field including the reverse polarity magnetic field, corrects the measurement by the second magnetic sensor B using the relative sensitivity matching value S to produce a corrected measurement, and then calculates the ambient magnetic field excluding any field provided by the one or more inductors by combining the measurement by the first magnetic sensor A and the corrected measurement derived from the second magnetic sensor B measurement, for example computing a difference or sum between the first magnetic sensor A measurement and the corrected measurement.

In one configuration, the control circuit controls the first magnetic sensor A to measure the ambient magnetic field and controls the second magnetic sensor B to measure the ambient magnetic field, possibly at the same time, and calculates a magnetic field gradient by correcting one of the measured values and combining the corrected value with the other measured value. The control circuit can control the one or more inductors to provide no magnetic field during the measurements or can control the one or more inductors to provide a magnetic field during the measurements.

In an embodiment, the relative sensitivity matching value S includes or is a multiplication or division factor, the relative sensitivity matching value S includes or is an additive or subtractive offset factor, or the relative sensitivity matching value S includes both a multiplication or division factor and an additive or subtractive offset factor.

A method of matching multiple magnetic sensors in a magnetic sensor device includes providing (i) a substrate having a surface, (ii) a first magnetic sensor A disposed at a first location on, over, or in direct contact with the surface, (iii) a second magnetic sensor B disposed at a second location on, over, or in direct contact with the surface, the magnetic sensor A and the magnetic sensor B both detecting a magnetic field, and the first location different from the second location, (iv) one or more inductors disposed over the substrate surface and located to provide a magnetic field to the first magnetic sensor A and a magnetic field to the second magnetic sensor B, and (v) a magnetic sensor controller having a control circuit including circuitry for controlling the first magnetic sensor A, the second magnetic sensor B, and the one or more inductors. The first magnetic sensor A is controlled with the control circuit to measure a first magnetic field A1, the second magnetic sensor B is controlled with the control circuit to measure a second magnetic field B1, and the one or more inductors are controlled with the control circuit to provide no magnetic field (fifth magnetic field). The first magnetic sensor A is controlled with the control circuit to measure a third magnetic field A2, the second magnetic sensor B is controlled with the control circuit to measure a fourth magnetic field B2, and the one or more inductors are controlled with the control circuit to provide a magnetic field (sixth magnetic field). The control circuit calculates a relative sensitivity matching value S that converts magnetic field values measured by the first magnetic sensor A to a comparable magnetic field value measured by the second magnetic sensor B or converts magnetic field values measured by the second magnetic sensor B to a comparable magnetic field value measured by the first magnetic sensor A. In particular embodiments of the present invention, the control circuit may for instance calculate a ratio of difference values between first and third magnetic field and second and fourth magnetic field, i.e. the value $((A1-A2)/(B1-B2))$, to produce the relative sensitivity matching value S.

In embodiments, the first magnetic sensor A is controlled by the control circuit to measure the ambient magnetic field, the second magnetic sensor B is controlled by the control circuit to measure the ambient magnetic field, and the control circuit corrects the measurement by either the first or second magnetic sensors A, B and combines the corrected measurement and the uncorrected measurement to form a magnetic field measurement. The one or more inductors can be controlled by the control circuit to provide no magnetic field during the measurements or controlled by the control circuit to provide a magnetic field during the measurements.

The first magnetic sensor A can be controlled by the control circuit to measure the ambient magnetic field and the second magnetic sensor B can be controlled by the control circuit to measure the ambient magnetic field at the same time.

In another method, the control circuit controls the one or more inductors to provide a magnetic field having a forward polarity and the first magnetic sensor A to measure the ambient magnetic field including the forward polarity magnetic field, controls the one or more inductors to provide a magnetic field having a reverse polarity and the first magnetic sensor A to measure the ambient magnetic field including the reverse polarity magnetic field, and then calculates the ambient magnetic field excluding any field provided by the one or more inductors by combining the two measurements, for example computing a sum or difference between the two measurements.

Alternatively, the control circuit controls the one or more inductors to provide a magnetic field having a forward polarity and the first magnetic sensor A to measure the ambient magnetic field including the forward polarity magnetic field, controls the one or more inductors to provide a magnetic field having a reverse polarity and the first magnetic sensor B to measure the ambient magnetic field including the reverse polarity magnetic field, corrects the measurement by the second magnetic sensor B using the relative sensitivity matching value S to produce a corrected measurement, and then calculates the ambient magnetic field excluding any field provided by the one or more inductors by combining the measurement by the first magnetic sensor A and the corrected measurement, for example by adding or subtracting the measurements.

In some embodiments of the present invention, the control circuit controls the first magnetic sensor A to measure a first magnetic field A1 and the one or more inductors to provide a fifth magnetic field, controls the first magnetic sensor A to measure a third magnetic field A2 and the one or more inductors to provide a sixth magnetic field, controls the second magnetic sensor B to measure a second magnetic field B1 and the one or more inductors to provide the fifth magnetic field, and controls the second magnetic sensor B to measure a fourth magnetic field B2 and the one or more inductors to provide the sixth magnetic field. In some embodiments, the fifth magnetic field is zero. In other embodiments, the fifth and sixth magnetic fields have opposite directions or have a common magnitude.

In another method, the control circuit controls the first magnetic sensor A to measure the ambient magnetic field, controls the second magnetic sensor B to measure the ambient magnetic field, possibly at the same time, and calculates a magnetic field gradient by correcting one of the measurements and combining the corrected measurement with the uncorrected measurement. In an embodiment, the control circuit controls the one or more inductors to provide no magnetic field during the measurements or to provide a magnetic field during the measurements.

In various methods, the relative sensitivity matching value S is calculated to include or is a multiplication or division factor, the relative sensitivity matching value S is calculated to include or is an additive or subtractive offset factor, or the relative sensitivity matching value S is calculated to include both a multiplication or division factor and an additive or subtractive offset factor.

The substrate can include an electronic circuit that controls the magnetic sensors A, B, the one or more inductors, or both. The electronic circuit can operate the magnetic sensors A, B to measure a magnetic field and can operate the one or more inductors to provide a test magnetic field. The electronic circuit can also include a calculation circuit that calculates correction or calibration factors for magnetic field measurements.

The circuit can provide current to all of the one or more inductors at the same time or to less than all of the one or more inductors at the same time. The circuit can provide current to inductors on opposite sides of the magnetic sensor and not to others of the inductors at the same time. The circuit can sequentially provide power to one or a group of inductors and subsequently provide current to another one or group of inductors to enable measurements of magnetic fields having field lines with different directions.

The one or more inductors can provide a magnetic field at the magnetic sensor location greater than or equal to 1 mT, 3 mT, 5 mT, 10 mT, 15 mT, 20 mT, or 50 mT.

Embodiments of the present invention provide effective calibration methods and structures for magnetic sensors operable under a wide range of measurement conditions for detecting a wide range of magnetic fields in different locations.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
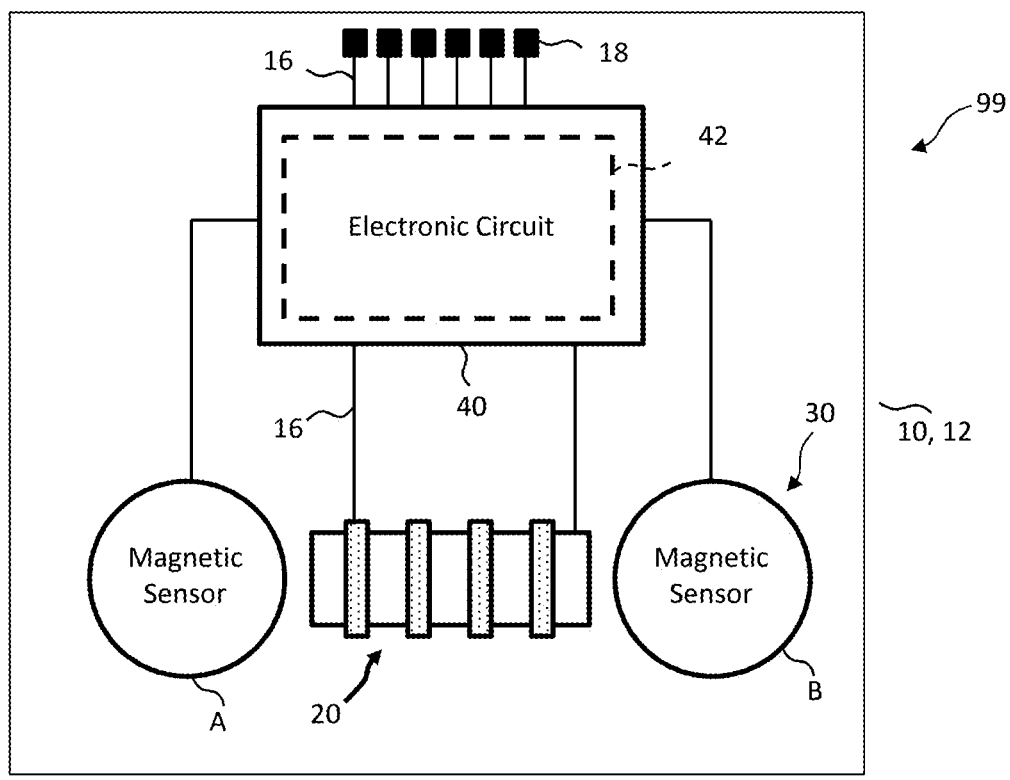
FIG. 1 is a plan view of an embodiment of the present invention having a single inductor.

The features and advantages of the present disclosure will become more apparent from the detailed description set forth below when taken in conjunction with the drawings, in which like reference characters identify corresponding elements. In the drawings, like reference numbers generally indicate identical, functionally similar, and/or structurally similar elements. The figures are not drawn to scale since the variation in size of various elements in the Figures is too great to permit depiction to scale. The dimensions and relative dimensions do not necessarily correspond to actual reduction to practice of the invention. The drawings are only schematic, and they are not intended to be limiting. Also reference signs in the claims shall not be construed as limiting the scope.

DETAILED DESCRIPTION OF ILLUSTRATIVE EMBODIMENTS

Embodiments of the present invention provide effective calibration methods and structures for magnetic sensors operable under a wide range of measurement conditions for detecting a wide range of magnetic fields in different locations in a reduced form factor and with improved manufacturability. Referring to the plan view of FIG. 1 and the perspective view of FIG. 3, a magnetic sensor device 99 comprises a substrate 10 having a surface. A first magnetic sensor A for detecting a magnetic field is disposed at a first location on, over, or in direct contact with the substrate 10 surface. A second magnetic sensor B for detecting the same or a different magnetic field is disposed at a second location on, over, or in direct contact with the substrate 10 surface. For example, the first or second magnetic sensor A or B can be disposed on a dielectric layer 12 that insulates the magnetic sensor A or B from the underlying substrate 10, for example a conductive or semiconductor substrate 10. The first location is different from the second location. The first and second magnetic sensors A, B are collectively referred to herein as magnetic sensors 30.

One or more inductors 20 are disposed over the substrate 10 surface and located to provide a magnetic field to the first magnetic sensor A at the first location and to the second magnetic sensor B at the second location. In an embodiment, the magnetic field at the first location has the same strength and/or field orientation as the magnetic field at the second location. In another embodiment, the magnetic field at the first location has a different strength and/or field orientation as the magnetic field at the second location. In an embodiment, the inductor 20 is a magnetic field source, a coil, a solenoid, or a straight conductor. Both the coil and the solenoid are helically wound conductors. The straight conductor is a straight wire through which a current passes to create a magnetic field.

A magnetic sensor controller 40 has a control circuit 42 that includes circuitry for controlling the first magnetic sensor A, the second magnetic sensor B, and the one or more inductors 20. In one configuration of the magnetic sensor device 99, the magnetic sensor controller 40, the first magnetic sensor A, or the second magnetic sensor B is a packaged integrated circuit. In another configuration, the magnetic sensor controller 40, the first magnetic sensor A, or the second magnetic sensor B is a surface mount device or a bare integrated circuit die, for example micro-transfer printed to the substrate 10 surface. Alternatively, one or more of the magnetic sensor controller 40, the first magnetic sensor A, or the second magnetic sensor B is formed in or on the substrate 10 surface and is native to the substrate 10. The substrate 10 can be a semiconductor substrate, for example with a dielectric layer 12 disposed on the semiconductor substrate 10.

By controlling the electrical current through the coil 25 formed by the inductor 20 (see FIG. 2A), the control circuit 42 forms a magnetic field that is detected by the magnetic sensors 30. The magnetic sensors 30 can detect the magnetic field or changes in the magnetic field, for example due to externally generated magnetic fields or the presence of magnetically sensitive materials, such as ferromagnetic materials.

In one embodiment, the magnetic sensor device 99 comprises a plurality of inductors 20 and coils 25 and the control circuit 42 provides current to all of the inductors 20 at the same time. In another embodiment, the magnetic sensor device 99 comprises a plurality of inductors 20 and the control circuit 42 provides current to less than all of the inductors 20 at the same time. In yet another embodiment, the magnetic sensor device 99 comprises a plurality of inductors 20 and the control circuit 42 provides current to only some and not all of the inductors 20 at the same time. In a further embodiment, the magnetic sensor device 99 comprises a plurality of inductors 20 and the control circuit 42 provides current to a group of inductors 20 at the same time and then subsequently provides current to a different group of inductors 20 at the same time, for example to measure magnetic fields associated with magnetic field lines having a direction or gradient.

In an embodiment of the present invention, the magnetic sensor controller 40 and control circuit 42 are electrically connected to the first magnetic sensor A, the second magnetic sensor B, and the one or more inductors 20 through substrate conductors 16. The magnetic sensor controller 40 can be itself controlled by an external device, for example an electronic system incorporated into an automobile, through electrical connections such as flex or ribbon cables to substrate 10 contact pads 18 that are electrically connected to the control circuit 42 through substrate conductors 16. The electrical substrate conductors 16 can be patterned metal traces or wires, made using photolithographic or printed circuit techniques and materials on or in the substrate 10 or the dielectric layer 12.

The control circuit 42 and magnetic sensor controller 40 can be an electronic circuit, for example an analog electronic circuit, a digital electronic circuit, or a mixed-signal electronic circuit, and can include logic circuits for calculating or computing, a computer, state machines, transistors, power transistors, and/or circuits for providing or receiving electronic signals including voltage or current signals. The control circuit 42 can comprise one or more digital or analog computing, calculating, or controlling devices or circuits either on the substrate 10 or external to the substrate 10, or both.

The first magnetic sensor A or the second magnetic sensor B can be any one of a variety of suitable electrically operated magnetic sensors, for example, a Hall sensor, a magneto-resistive sensor, a fluxgate sensor, or a magneto-inductive sensor and can be formed in, on or over the substrate 10 or disposed in, on, or over the substrate 10, for example by micro-transfer printing or using surface-mount techniques. The magnetic sensors 30 can be provided in integrated circuits disposed on the substrate 10 or in circuits formed or disposed on, in, or in direct contact with the substrate 10, a surface of the substrate 10, or a layer on the substrate 10, such as dielectric layer 12. The first magnetic sensor A, the second magnetic sensor B, or the magnetic sensor controller 40 can be electrically connected with the substrate conductors 16.

Figure 2A:
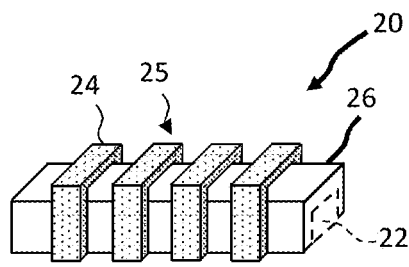
FIGS. 2A and 2B are a detail perspective view and cross-sectional view, respectively, of an inductor structure according to an embodiment of the present invention.
Figure 2B:
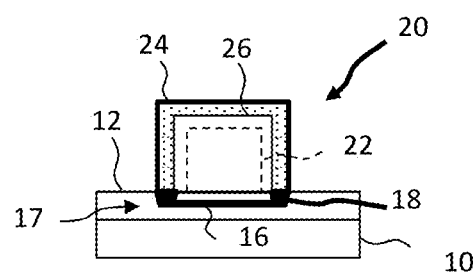

According to embodiments of the present invention and referring to the detailed perspective view of FIG. 2A and the corresponding cross section of FIG. 2B, an inductor 20 is a device that forms a magnetic field in response to an applied electrical current. The one or more inductors 20 can comprise a coil electrical conductor 24 helically wrapped in a coil 25 (a helix) around a core 22. The coil electrical conductor 24 can be a metal conductor (e.g., a metal wire, such as copper, aluminum, tungsten, silver, gold, titanium, tin, or other metals or metal alloys) or any material that conducts electricity. The one or more inductors 20 generate a magnetic field when provided with electrical current through the coil 25. The core 22 of each inductor 20 extends along the length of each inductor 20, where the length is the longest dimension of the inductor 20, or extends in the direction of a center line at the center of each coil 25. The core 22 can be any of a variety of substances, for example air (i.e., atmosphere) or a ferromagnetic material (e.g., iron). Because ferromagnetic materials can themselves conduct electricity, the core 22 can be insulated from the electrically conductive coil 25 with a core insulator 26, as shown in the perspective view of FIG. 2A and the cross section of FIG. 2B. The core insulator 26 can be coated or disposed over the core 22 (as shown). In another embodiment, the core insulator 26 is provided around the coil electrical conductors 24 (wires) of the coil 25 (not shown), or only in the location of the coil electrical conductors 24 over the core 22, and can include a portion of an insulating dielectric layer 12 disposed over the substrate 10. The core insulator 26 can be any of a variety of insulators, for example a plastic, a resin, a cured polymer, an oxide such as silicon dioxide, or a nitride such as silicon nitride. The inductor 20 or core 22 can be adhered to a surface of the substrate 10 or embedded in a layer on the substrate 10, for example disposed or embedded in the dielectric layer 12 or an adhesive provided on the substrate 10. The dielectric layer 12 can be a polymer or other insulator such as silicon dioxide or a cured adhesive, such as SU8. The coil electrical conductors 24 can be connected between the core 22 and the substrate 10 with an electrical substrate conductor 16, for example made using photolithographic processes and electrically conductive materials such as metal. Vias 17 can be used to connect the coil electrical conductors 24 with the substrate conductors 16 if the dielectric layer 12 provides insulation to the core 22.

In an embodiment of the present invention, at each point where the coil electrical conductors 24 of the coil 25 contact the substrate 10 or a layer (e.g., dielectric layer 12) on the substrate 10, a substrate contact pad 18 is disposed that forms an electric connection through a via 17 to the corresponding electrical substrate conductor 16 of the coil 25 (FIG. 2B). Adjacent substrate contact pads 18 are electrically connected on opposing sides of the inductor 20 location with substrate conductors 16 to connect the coil electrical conductors 24 in a helical coil 25. Thus, electrical signals sent from the control circuit 42 through a substrate conductor 16 to a first substrate contact pad 18 pass through the first substrate contact pad 18 into a coil electrical conductor 24 of the coil 25, pass through a first coil electrical conductor 24 of the coil 25 over the core 22 to the other side of the inductor 20, enter a second substrate contact pad 18 and pass into a second substrate conductor 16, pass under the inductor 20 into a third substrate contact pad 18, into a second coil electrical conductor 24 of the coil 25 and over the core 22, again, and so on, until the electrical signal is returned through a substrate conductor 16 to the control circuit 42. As shown in FIG. 2B, the coil electrical conductor 24 (and the core 22) is insulated from the substrate conductors 16 by the dielectric layer 12. Thus, the substrate contact pads 18 formed over vias 17 in the dielectric layer 12 enable electrical contact between the coil electrical conductors 24 and the substrate conductors 16.

The substrate 10 can be one of many substrates with a surface capable of supporting or receiving the magnetic sensor 30 and one or more inductors 20, for example a glass, plastic, ceramic, or semiconductor substrate with two opposing relatively planar and parallel sides. The substrate 10 can have a variety of thicknesses, for example 10 micrometers to several millimeters. The substrate 10 can be a portion or surface of another device or integrated circuit and can include electronic circuitry.

Figure 6:
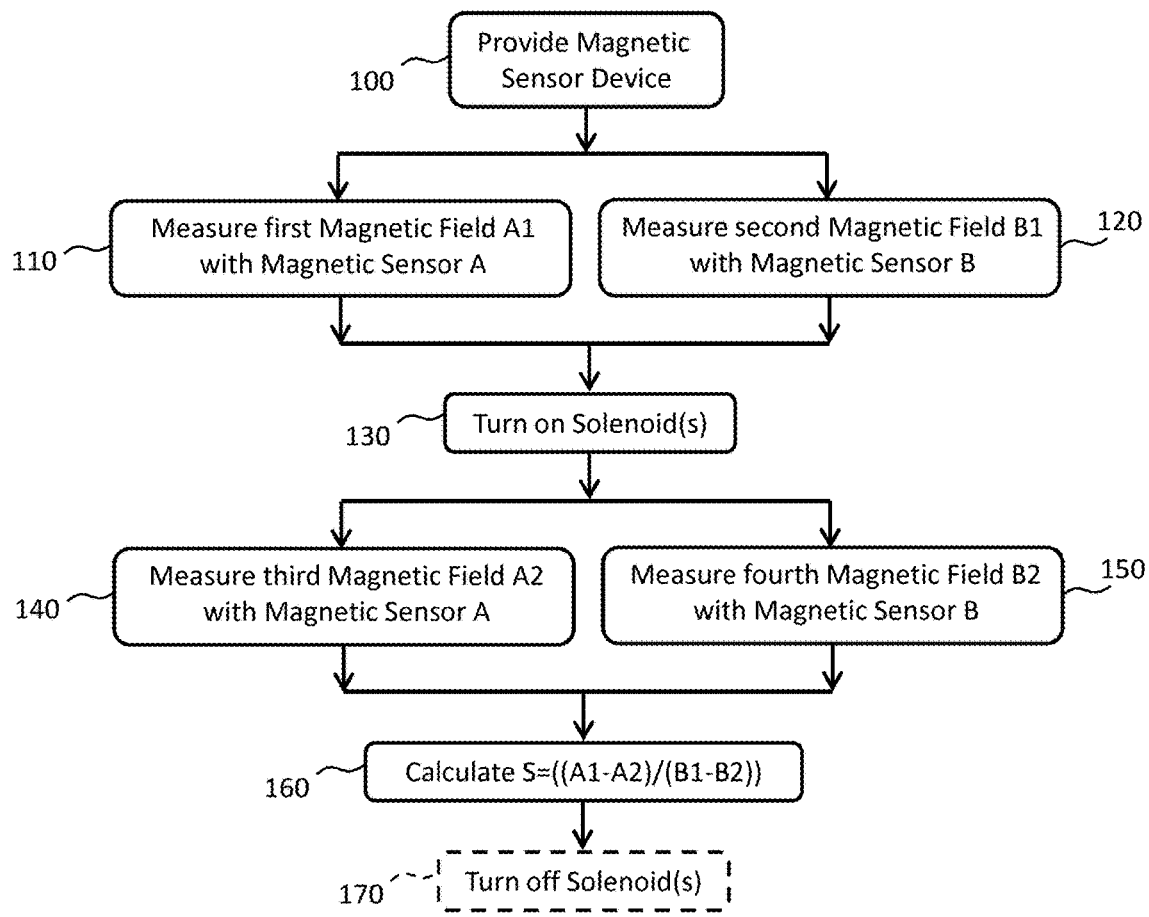
FIGS. 6-10 are flow diagrams illustrating various methods of embodiments of the present invention.

According to embodiments of the present invention and referring also to the flow diagram of FIG. 6, in operation a magnetic sensor device 99 is provided in step 100. In step 110, the control circuit 42 controls the first magnetic sensor A to measure a first magnetic field A1 and the one or more inductors 20 to provide a fifth magnetic field, for example no (zero) magnetic field. Before, after, or at the same time, in step 120, the control circuit 42 controls the second magnetic sensor B to measure a second magnetic field B1 and the one or more inductors 20 to provide the fifth magnetic field, for example no magnetic field, or a different magnetic field. The measured first and second magnetic fields can be the same magnetic field. In step 130, the sixth magnetic field generated by the one or more inductors 20 is controlled by the magnetic sensor controller 40, to provide a sixth magnetic field that can be different from the fifth magnetic field. Either one of the fifth and sixth magnetic fields may for instance be zero magnetic fields. The first magnetic sensor A is controlled in step 140 to measure a third magnetic field A2 under the magnetic influence of the inductor-induced sixth magnetic field and, before, after, or at the same time, the second magnetic sensor B is controlled in step 150 to measure a fourth magnetic field B2 under the magnetic influence of the inductor-induced sixth magnetic field. The measured third and fourth magnetic fields can be the same magnetic field, a forward-polarity magnetic field, or a reverse-polarity magnetic field. The polarity of the fifth and sixth magnetic field provided by one inductor 20 can be opposite the polarity of the magnetic field of the other inductor 20 (i.e. one inductor 20 can produce a forward-polarity magnetic field and a different inductor 20 can produce a reverse-polarity magnetic field) and can have a common magnitude. (The polarity of a magnetic field corresponds to the direction of the field and opposing polarity fields have opposite directions.) Steps 140 and 150 can be done before (not shown) or after (as shown) steps 110 and 120, so long as the one or more inductors 20 are controlled to produce a non-zero magnetic field (for steps 140, 150) or a different, potentially zero, magnetic field (steps 110, 120) by turning the fifth and sixth magnetic fields generated by the one or more inductors on (step 130) or off (step 170), as appropriate. In one efficient method, steps 110 and 120 are done at the same time and steps 140 and 150 are done at the same to reduce the number of times the fifth and sixth magnetic fields generated by the one or more inductors 20 are turned on or off.

After the first to fourth magnetic field measurements A1, A2, B1, B2 are made, the control circuit 42 of the magnetic sensor controller 40 can calculate a value (for instance, but not limited thereto, (A1−A2)/(B1−B2)) in step 160 that is, provides, or contributes to a relative sensitivity matching value S. The value S can be a relative sensitivity matching value that converts first and third magnetic field values measured by the first magnetic sensor A to comparable second and fourth magnetic field values measured by the second magnetic sensor B or converts second and fourth magnetic field values measured by the second magnetic sensor B to comparable first and third magnetic field values measured by the first magnetic sensor A. Two comparable values can be directly compared without requiring a functional conversion, for example by finding a difference, a sum, or an average of the two comparable values. Optionally, the sixth magnetic field generated by the inductor 20 is turned off in step 170, after or before the calculation of step 160.

The magnetic sensors A and B can be calibrated to compensate for a known susceptibility to environmental influences that are present during the measurements or have a pre-determined or systematic difference that can also be corrected by a calibration. Thus, the measurements of the first to fourth magnetic fields A1, A2, B1, B2 can be corrected in response to known calibration parameters, either at all times, or in response to transient or environmental factors.

In general, a magnetic sensor 30 will detect a magnetic field from the sensor itself and any external, stray magnetic fields induced by the environment. If an inductor also produces a magnetic field, then the magnetic sensor will respond to the sum of these fields, $B=B_M+B_E+B_S$, where $B_M$ is the sensor magnetic field, $B_E$ is the external, stray magnetic field, and $B_S$ is the field due to the inductor coil 25. Different sensors (e.g., first and second magnetic sensors A, B) will also have different sensitivities (responses) to a magnetic field due to differences in materials and the manufacturing process. According to embodiments of the present invention, these differences can be discounted by calculating:

$$((A1-A2)/(B1-B2)) = \left(\frac{A1-A2}{B1-B2}\right) = \left(\frac{(A1M+A1E)-(A2M+A2E+A2S)}{(B1M+B1E)-(B2M+B2E+B2S)}\right)$$

Since the first magnetic field A1 and the third magnetic field A2 are different measurements made by the same first magnetic sensor A so that $A1_M=A2_M$, since the second magnetic field B1 and the fourth magnetic field B2 are different measurements made by the same second magnetic sensor B so that $B1_M=B2_M$, and assuming that the external stray magnetic field does not change between the first and second measurements so that $A1_E=A2_E$ and $B1_E=B2_E$ then the equation reduces to $$\left(\frac{A2S}{B2S}\right) = (A2_S/B2_S),$$

which is, provides, or contributes to the relative sensitivity S of the magnetic sensor A with respect to the magnetic sensor B.

In other embodiments, the relative sensitivity matching value S is or includes an additive or subtractive offset value, for example determined at the time of magnetic sensor device 99 production. Thus, in a further embodiment, S=k*c−f, where S is the corrected measurement (in Gauss, for example), k is the sensitivity, c is the measurement value (expressed in Volts, for example), and f is an offset. K, c and f are calculated or measured constants and c can for instance equal ((A1−A2)/(B1−B2)). The offset value f can be dependent on the current provided through the electrical conductors 24 of the coil 25 of the inductor 20. In consequence, embodiments of the present invention can operate even if different electrical currents are provided for different measurements for the magnetic sensors A, B. In various embodiments, the relative sensitivity matching value S includes or is a multiplication or division factor, the relative sensitivity matching value S includes or is an additive or subtractive offset factor, or the relative sensitivity matching value S includes both a multiplication or division factor and an additive or subtractive offset factor. In general, the relative sensitivity matching value S is a transformation value, function, algorithm, or operation that corrects (converts or matches) measurements made by one magnetic sensor 30 to corrected measurements that are comparable to measurements made by another magnetic sensor. Although shown in some embodiments herein as the equation ((A1−A2)/(B1−B2)) and used as to correct measurements by multiplication, the relative sensitivity matching value S is not limited to that equation and the correction function is not limited to a product. The relative sensitivity matching value S and correction function can incorporate other factors or functions such as linear equations, algorithms, or other additive, subtractive, multiplicative, or divisive constants or mathematical transformations.

Note that it is not essential that the magnetic field produced by the one or more inductors 20 is the same at the first and second locations of the corresponding first magnetic sensor A and second magnetic sensor B, since any differences will be included in the relative sensitivity matching value S. The relative sensitivity matching value S can then be applied to any magnetic field value measured by the second magnetic sensor B to a comparable value measured by the first magnetic sensor A or vice versa by calculating or otherwise converting the measured magnetic field value appropriately using the relative sensitivity matching value S.

Figure 7:
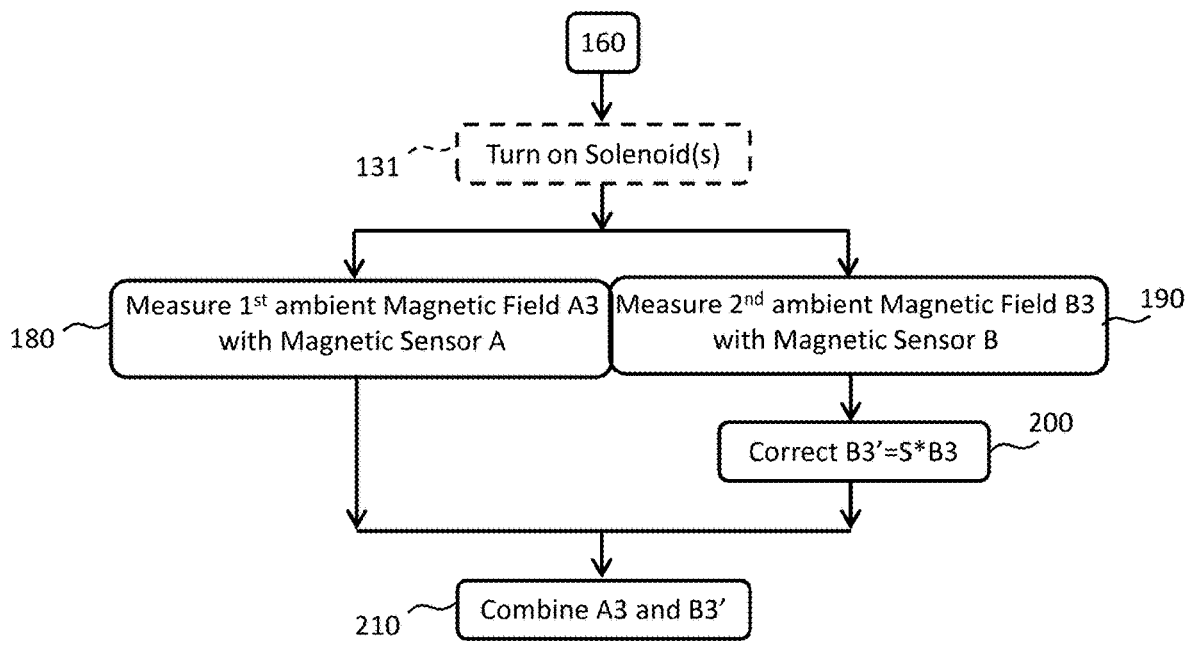

Referring to FIG. 7, for example, with or without the magnetic field produced by the one or more inductors 20 under the control of the magnetic sensor controller 40 (e.g., optional step 131), first and second ambient magnetic fields A3 and B3 can be measured in steps 180 and 190 by first magnetic sensor A and second magnetic sensor B. In an embodiment, the measurements are done at the same time but, in other embodiments, they can be done at different times. One of the measured first and second ambient magnetic fields A3 or B3 is converted in step 200 using the relative sensitivity matching value S to provide a corrected ambient magnetic field value B3' (as illustrated, or A3' (not illustrated)) and combined in step 210 with the other of the measured first and second ambient magnetic fields A3 or B3 to produce a final measured ambient magnetic field value that is indifferent to differences in first magnetic sensor A and second magnetic sensor B or to stray external fields, as long as the stray external magnetic fields are constant or consistent between the first magnetic sensor A and second magnetic sensor B. Since the calibration steps of FIG. 6 can be repeated as often as necessary after manufacturing or in operation, the relative sensitivity matching value S can adapt to a variety of factors including changes in environment (e.g., temperature or humidity), changes in device materials or structure due to aging or operation, or changes in external stray magnetic fields.

Figure 3:
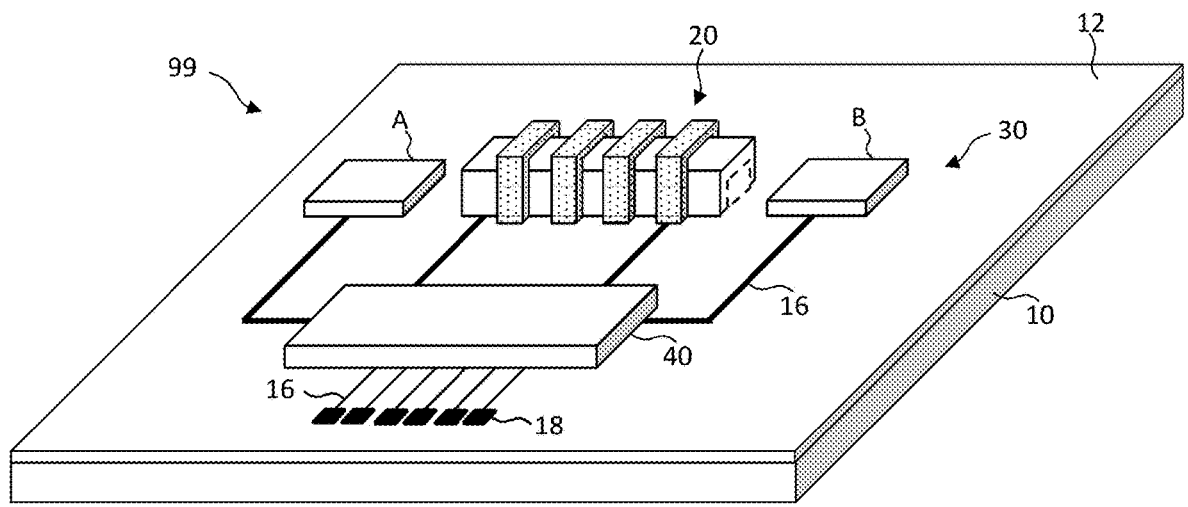
FIG. 3 is a perspective view of an embodiment of the present invention corresponding to FIG. 1.

As shown in FIGS. 1 and 3, embodiments of the present invention can include only a single inductor 20. In general, however, various embodiments of the present invention can include multiple magnetic sensors 30 sharing a common inductor 20 (as in FIGS. 1 and 3), multiple magnetic sensors 30 each having a corresponding associated individual inductor 20 (as in FIGS. 4A, 4B, 4C, 4D and 5A, 5B), or multiple magnetic sensors 30 and shared or individual multiple inductors 20.

Figure 4A:
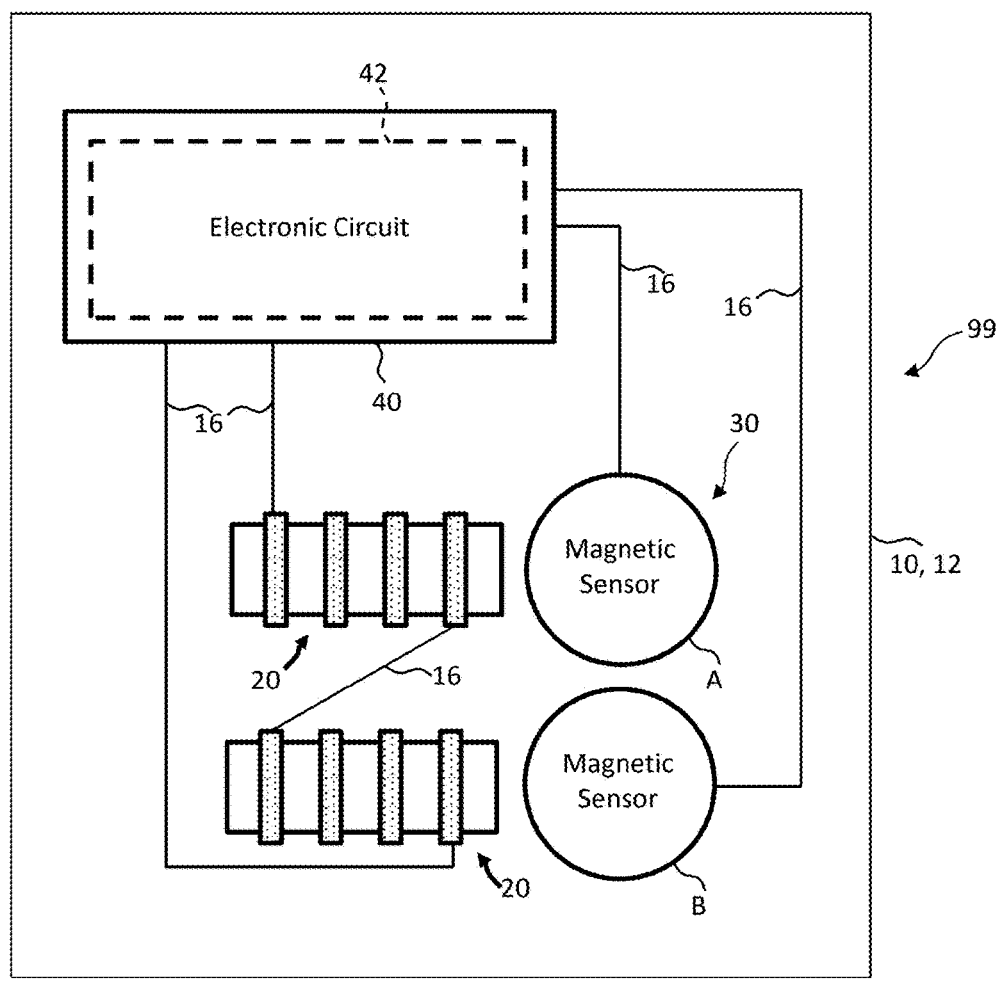
FIG. 4A is a plan view of an alternative embodiment of the present invention having multiple inductors.
Figure 4B:
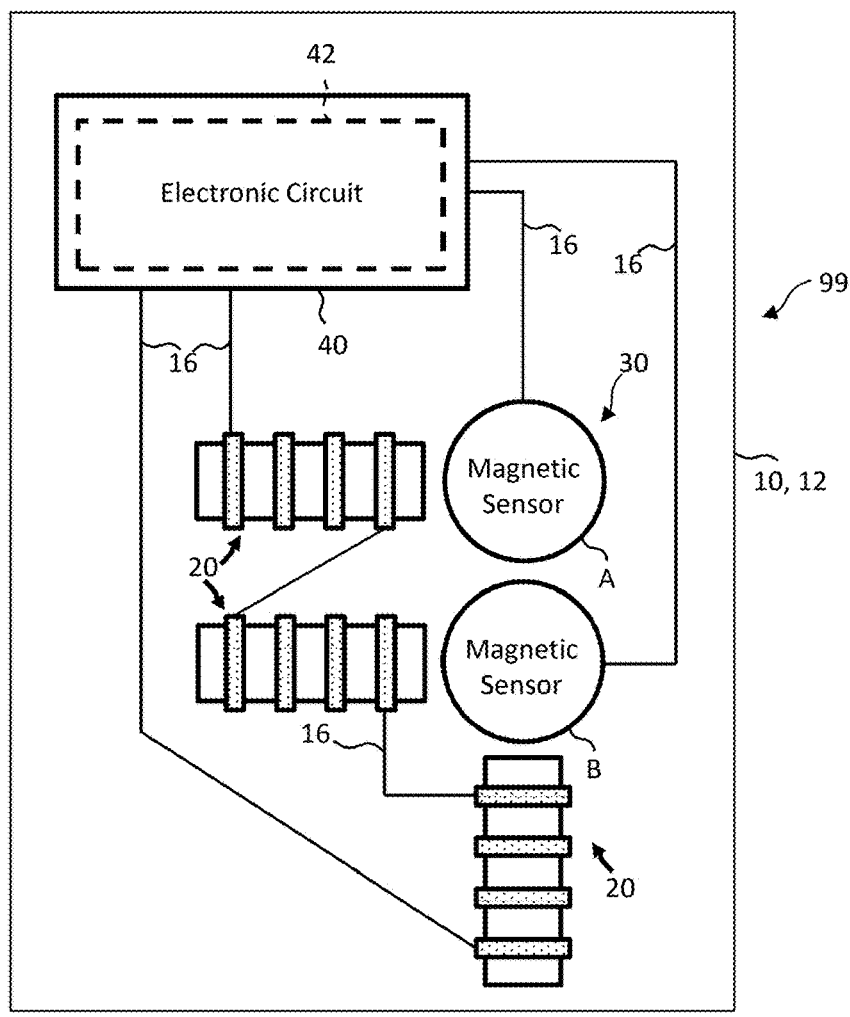
FIG. 4B is a plan view of an alternative embodiment of the present invention having multiple inductors that form magnetic fields in different directions.
Figure 4C:
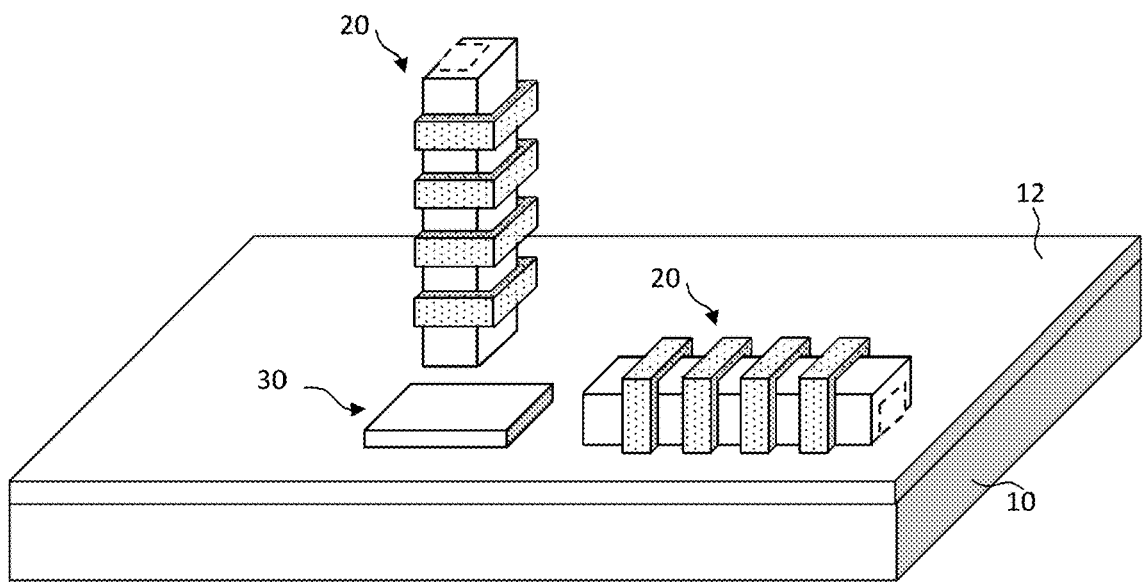
FIG. 4C is a perspective view of an embodiment of the present invention having two inductors in different planes.
Figure 4D:
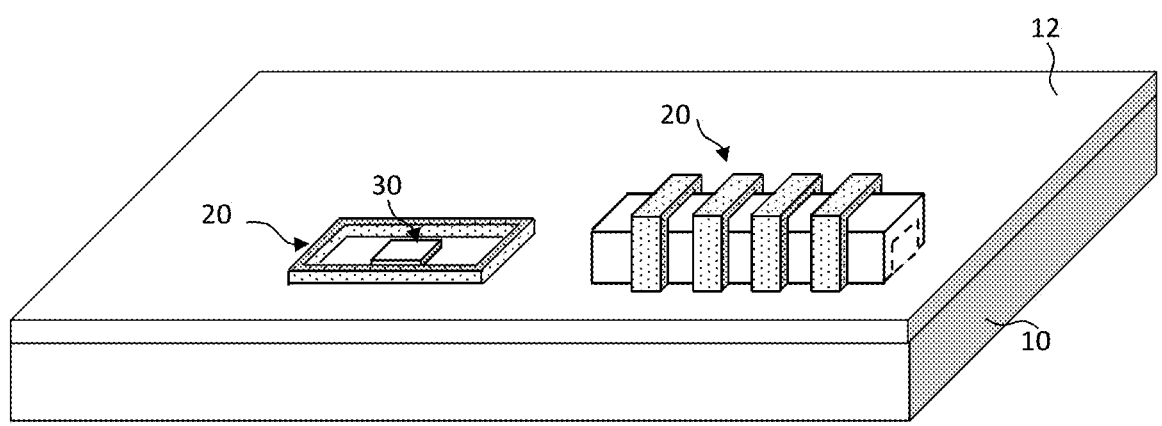
FIG. 4D is a perspective view of an embodiment of the present invention two inductors in different planes, of which one is a planar coil.
Figure 5A:
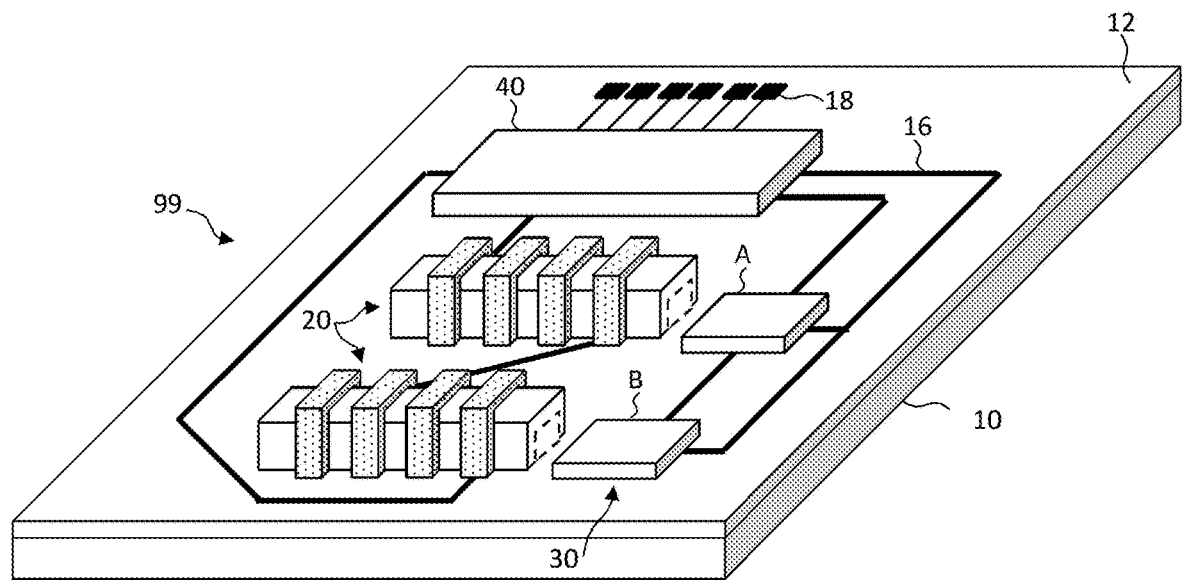
FIG. 5A is a perspective view of an embodiment of the present invention corresponding to FIG. 4A.

Referring to the plan view of FIG. 4A and the corresponding perspective view of FIG. 5A, a magnetic sensor device 99 in an embodiment of the present invention includes two inductors 20, each arranged to provide a magnetic field to a corresponding associated magnetic sensor 30 (e.g., first magnetic sensor A and second magnetic sensor B) disposed on a substrate 10 or dielectric layer 12. The inductors 20 can be electrically connected in series (as shown) with substrate conductors 16 so that an identical electrical current passes through each inductor 20 in response to the magnetic sensor controller 40 control circuit 42. Alternatively, the inductors 20 can be electrically connected in parallel (not shown) and the same or different electrical currents can be passed through the different inductors 20. The inductors 20 can be similar and produce similar magnetic fields or can be different and produce different magnetic fields. The magnetic sensors 30 can be located in a similar location or direction with respect to a corresponding associated inductor 20 or in a different location or direction, as shown in FIG. 4B. In one embodiment, the inductors 20 form magnetic fields in orthogonal directions in a common plane (FIG. 4B, for example when the centerlines of the inductors 20 are in a common plane) and in other embodiments, as shown in FIGS. 4C and 4D, the inductors 20 form magnetic fields in orthogonal directions in different planes, for example when the centerlines of the inductors 20 are not in a common plane. Such structures can be formed when the centerlines of different inductors 20 are, for example, in the x, y, or z directions and can be perpendicular to each other in any arrangement or combination. In some configurations of the present invention, as for instance illustrated in FIG. 4D, inductors 20 can be planar coils integrated on a surface or in a plane on or over a substrate 10 or a dielectric layer 12, for example on an integrated circuit. In these cases any combination of the magnetic fields Bx, By, and Bz present can be orthogonal to each other in one plane or in different planes. FIG. 4B also illustrates embodiments in which the magnetic field provided by two different inductors 20 are sensed by a common magnetic sensor 30 (magnetic sensor B). In general, any magnetic sensor 30 can sense the magnetic field of one or more inductors 20 and the magnetic field produced by an inductor 20 can be sensed by one or more magnetic sensors 30 (e.g., as in FIG. 3). Any such differences can be accommodated by the relative sensitivity matching value S and the response of one magnetic sensor 30 can be converted to a comparable response for another magnetic sensor 30.

Figure 8:
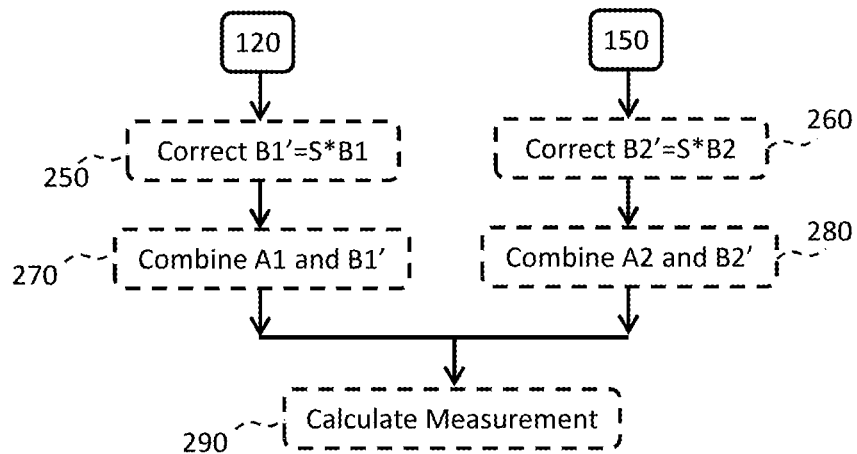

In various methods and embodiments of the present invention, referring to the flow diagram of FIG. 8, measurements made by one sensor (e.g., first magnetic sensor A) can be corrected or converted to be comparable to measurements made by another sensor (e.g., second magnetic sensor B) using the relative sensitivity matching value S. In step 250, the second magnetic field measurement B1 (made with the fifth inductor-induced magnetic field, e.g. without an inductor-induced magnetic field) is converted to value BF and combined with the first magnetic field measurement A1 in step 270. Similarly, in step 260, the fourth magnetic field measurement B2 (made with the sixth inductor-induced magnetic field different from the fifth inductor-induced magnetic field, e.g. with a non-zero inductor-induced magnetic field) is converted to value B2' and combined with the third magnetic field measurement A2 in step 280. The combined values can themselves be used to calculate, compare, or derive magnetic field values in step 290. The steps are illustrated in FIG. 8 with dashed lines denoting that they are optional steps that can be used for some magnetic field calculations and not in other calculations, or that different measured magnetic field values can be combined or compared to find useful magnetic field values.

The inductors 20 in the plurality of inductors 20 can be electrically connected in common, for example in series or in parallel, and operate at the same time in response to the same signal. In such an embodiment, the inductors 20 in the plurality of inductors 20 can also be considered as a single inductor 20 with multiple cores 22. Alternatively, each inductor 20 in the plurality of inductors 20 can be electrically separate and controlled separately from any of the other inductors 20 with separate electrical control signals, for example provided by the control circuit 42. In yet another embodiment, inductors 20 in different groups of inductors 20 in the plurality of inductors 20 are electrically connected in common, for example in series or in parallel, and the groups of inductors 20 are electrically separate and controlled separately from any of the other inductors 20 with separate electrical control signals.

Figure 9:
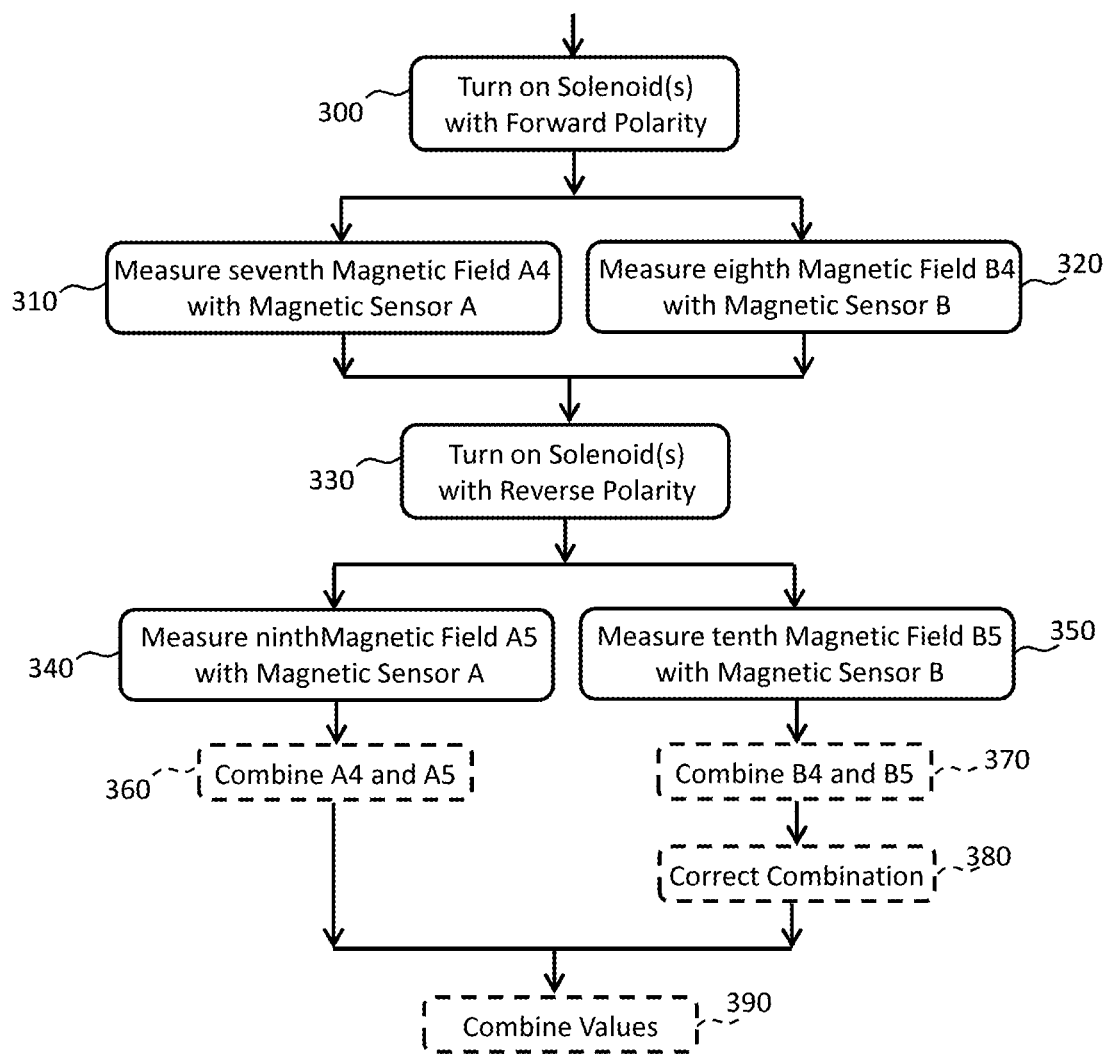

In another embodiment of the present invention, referring to FIG. 9, electrical current through the inductors 20 is controlled by the magnetic sensor controller 40 in a forward and in a reverse polarity, where the reverse polarity reverses the voltage across the terminals of the inductor 20 to send current through the inductor 20 in a reverse direction and form a magnetic field with reversed polarity. In step 300, the magnetic sensor controller 40 applies current to the coil(s) 25 of the one or more inductors 20 to form a magnetic field with a forward (positive) polarity. Seventh magnetic field A4 is measured by the first magnetic sensor A in step 310 and eighth magnetic field B4 is measured by the second magnetic sensor B in step 320. The magnetic sensor controller 40 then applies current to the coil(s) 25 of the one or more inductors 20 to form a magnetic field with a reverse (negative) polarity in step 330. Ninth magnetic field A5 is measured by the first magnetic sensor A in step 340 and tenth magnetic field B5 is measured by the second magnetic sensor B in step 350. The measurements of the seventh and ninth magnetic fields A4 and A5 are optionally combined in step 360 and the measurements of the eighth and tenth magnetic fields B4 and B5 are optionally combined in step 370. Thus, the magnetic sensor controller 40 can compute or calculate the ambient magnetic field excluding any field provided by the one or more inductors 20 by computing a sum or difference between the two measurements. Such a method also provides a signal having double the absolute magnitude, possibly reducing measurement noise in the calculated result. Furthermore, one or the other of the combined values can be optionally corrected with the relative sensitivity matching value S in step 380 and the result can be optionally combined with the other value in step 390 to provide an improved calculated value with reduced noise and greater confidence.

Alternatively, or in addition, the measurements, or combined measurements of the second magnetic sensor B can be converted (e.g., as in step 200) and combined with the measurements, or combined measurements, of the first magnetic sensor A, or vice versa as desired, for example as illustrated and discussed with respect to FIG. 8. Thus, the magnetic sensor controller 40 can compute or calculate the ambient magnetic field excluding any field provided by the one or more inductors 20 by computing a sum or difference or otherwise combining the measurement by the first magnetic sensor A and the corrected measurement by the second magnetic sensor B.

Figure 10:
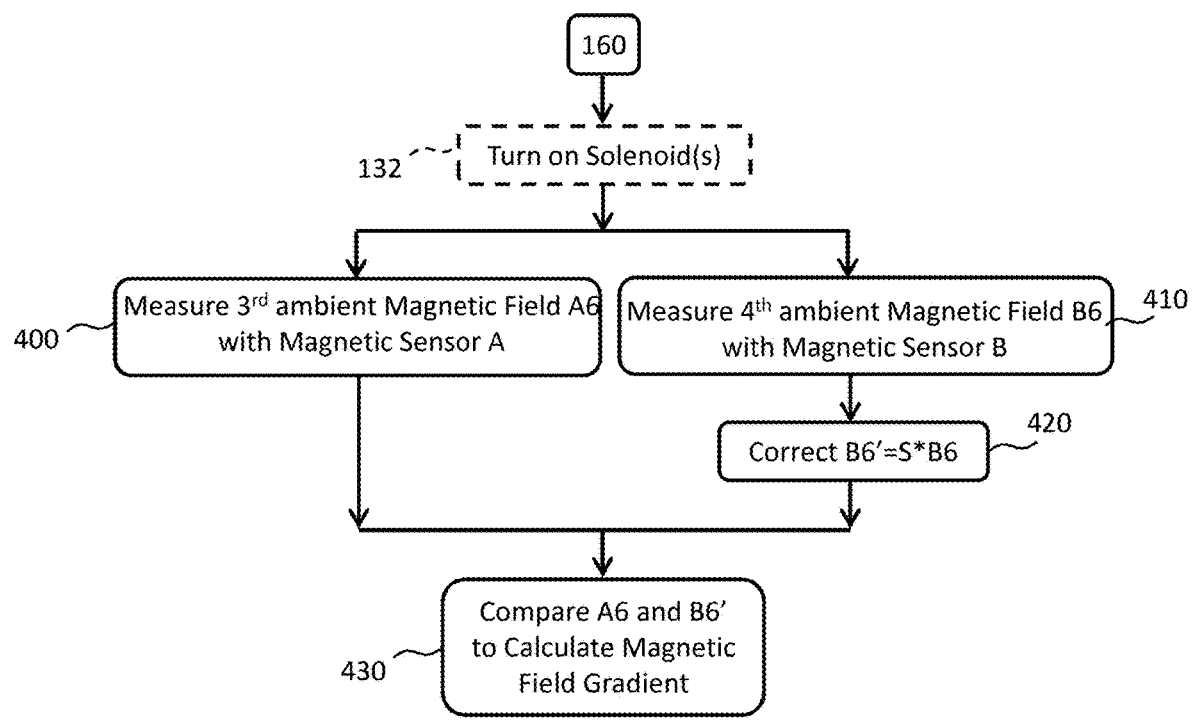

Referring next to FIG. 10, in another embodiment of the present invention, the difference in spatial location between the first magnetic sensor A and the second magnetic sensor B is exploited to measure the ambient magnetic field gradient. As shown in FIG. 10, after the relative sensitivity matching value S is computed in step 160, the one or more inductors 20 are optionally controlled by the magnetic sensor controller 40 to provide a magnetic field, or not, in step 132. In either case, the control circuit 42 controls the first magnetic sensor A to measure the third ambient magnetic field A6 in step 400 and controls the second magnetic sensor B to measure the fourth ambient magnetic field B6 in step 410. In an embodiment, the measurements are performed at the same time. One or the other of the measured third of fourth ambient magnetic fields A6 or B6 is corrected using the relative sensitivity matching value S in step 420. In step 430, the corrected measured value is compared to or combined with the other measured value to calculate a magnetic field gradient by correcting one of the measured values and combining the corrected value to the other measured value.

In general, the steps illustrated in FIGS. 6-10 can be repeated to make multiple, sequential magnetic field measurements over time. The magnetic sensor device 99 can be calibrated or otherwise adjusted between measurements or series of measurements, for example after periods of use or after a pre-determined number of uses.

If the current flow direction of the inductors 20 is alternated between measurements with a common current magnitude, the calibration can be done at the time of a measurement. The difference between the two measurements with opposing field directions provides a calibration value that can be applied to the measurements. Moreover, when more than two inductors 20 are present, any two of the inductors providing opposing fields can provide a calibration value and overlapping pairs of inductors 20 can provide related calibration values, enabling the calibration (matching) of more than two inductors 20 at a time.

Thus, in some embodiments of the present invention, the control circuit controls the first magnetic sensor A to measure a first magnetic field A1 and the one or more inductors to provide a fifth magnetic field, controls the first sensor A to measure a third magnetic field A2 and the one or more inductors to provide a sixth magnetic field, controls the second magnetic sensor B to measure a second magnetic field B1 and the one or more inductors to provide the fifth magnetic field, and controls the second magnetic sensor B to measure a fourth magnetic field B2 and the one or more inductors to provide the sixth magnetic field. In some embodiments, the fifth magnetic field is zero, as described above. In other embodiments, the fifth and sixth magnetic fields have opposite directions or have a common magnitude so that the measurements are comparable.

Figure 5B:
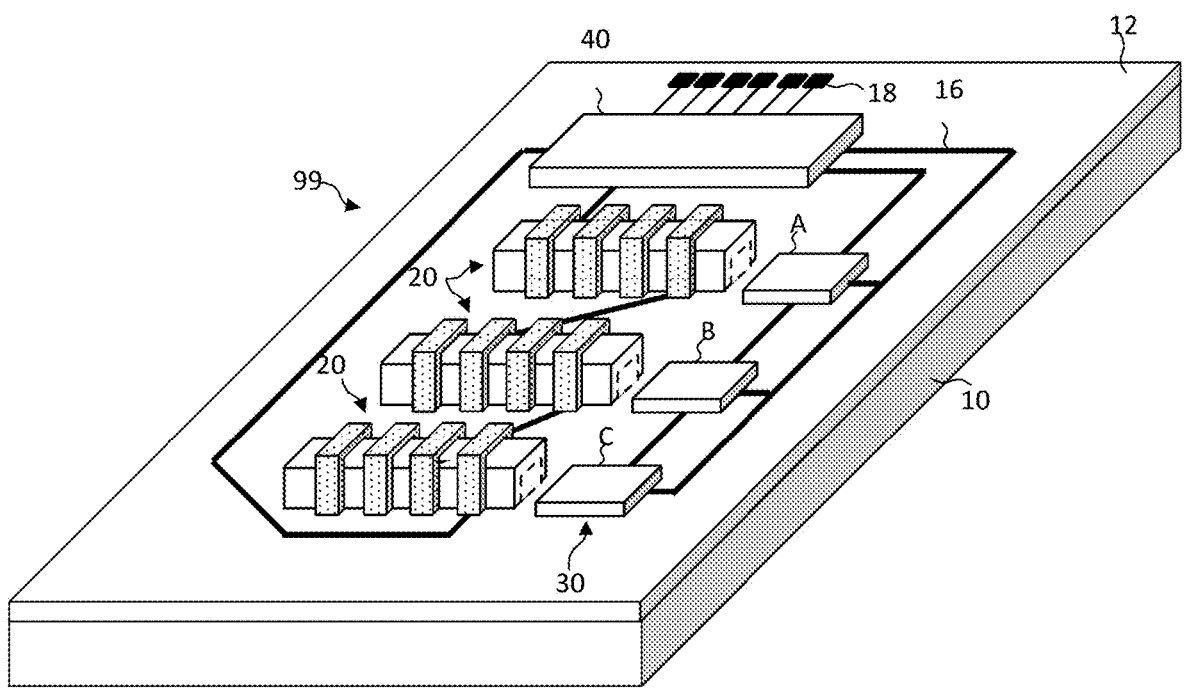
FIG. 5B is a perspective view of an embodiment of the present invention having three inductors.

In various embodiments of the present invention, more than the illustrated two first and second magnetic sensors A, B are included in the magnetic sensor device 99, for example as shown in FIG. 5B. FIG. 5B illustrates an embodiment with three inductors 20 and three corresponding common magnetic sensors A, B, C, all or any pair of which can be used for calculating the magnetic field. The sensitivity or response of each of the magnetic sensors 30 can be matched to a common magnetic sensor 30 with a possibly different relative sensitivity matching value S corresponding to each of the other magnetic sensors 30. The sensitivity or response of each of the magnetic sensors 30 can then be corrected to be comparable to the common magnetic sensor 30 and their measurements combined to provide improved or additional magnetic field values. For example, multiple measurements can provide a better estimate of the magnetic field gradient in a wider range of locations, for example in a spatially linear series or in mutually orthogonal locations to provide a two (or three) dimensional gradient measurement. In other embodiments, multiple measurements can be combined to provide a measurement with less noise, for example by averaging the multiple measurements or combinations of measurements or by finding multiple differences of measurements.

In an embodiment of the present invention, the magnetic sensor device 99 can be made by providing the substrate 10 and forming substrate conductors 16 and substrate contact pads 18 on the substrate 10, together with any necessary vias 17. In one configuration, the control circuit 42 is made on or in the substrate 10 using at least some of the same processing steps or materials, for example using photolithographic and integrated circuit methods and materials. Alternatively, the control circuit 42, for example an integrated circuit, is micro-transfer printed to the substrate 10 or layers on the substrate 10, for example the dielectric layer 12. The magnetic sensor 30 can also be made on or in the substrate 10 using at least some of the same processing steps or materials, for example using photolithographic and integrated circuit methods and materials or can be micro-transfer printed to the substrate 10 or layers on the substrate 10, for example the dielectric layer 12. Micro-transfer printed cores 22, magnetic sensors 30, or control circuits 42 enable a reduced form factor and improved functionality by, at least in part, dispensing with additional packaging.

If the magnetic sensor 30 or control circuit 42 are micro-transfer printed to the substrate 10 or layers on the substrate 10 (e.g., dielectric layer 12) they can be electrically connected to the substrate conductors 16 as desired through vias 17 and substrate contact pads 18 in any intervening layers (e.g., dielectric layer 12) as is commonly done in the integrated circuit and printed circuit board arts. Alternatively, the control circuit 42 or magnetic sensor 30 are surface mount devices and disposed using surface mount techniques. In an embodiment, the control circuit 42 is provided externally to the substrate 12 and electrically connected to the magnetic sensors 30 and one or more inductors 20 through wires, for example through a ribbon or flex cable.

Figure 11:
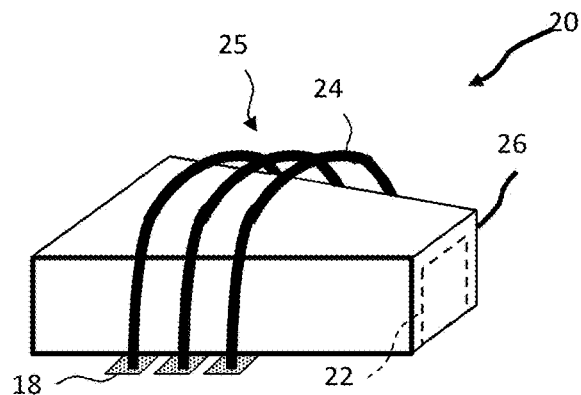
FIG. 11 is a perspective view of an inductor having wire-bond wires according to an embodiment of the present invention.

The core(s) 22 can be provided, for example in a tape and reel configuration, as surface mount components, or as micro-transfer printable components and disposed over, on, or in direct contact with the substrate 10 or layers on the substrate 10 such as dielectric layer 12, for example using pick-and-place, surface mount, or micro-transfer printing. In one embodiment, the cores 22 are coated with an insulator to form the core insulator 26 after disposition on the substrate 10, for example by spray or spin coating, by evaporation, or by sputtering, and cured, if necessary. Alternatively, the entire inductor 20 or core 22 and core insulator 26 is micro-transfer printed from a source wafer and disposed on or over the substrate 10 or any layers on the substrate 10. In an embodiment, the coil electrical conductors 24 are formed lithographically over the core 22 structure and in contact with the substrate contact pads 18 by depositing and patterning an electrically conductive material such as metal, as shown in FIG. 2B. In an alternative embodiment of an inductor 20, FIG. 11, the coil electrical conductors 24 are provided by wire-bond wires from a first substrate contact pad 18 on one side of the core insulator 26, over the core insulator 26 to the other side of the core insulator 26, to a second substrate contact pad 18, to form the helical coil 25. In this embodiment, the wire-bonded wires are the coil electrical conductors 24. In an embodiment, if the electrical conductors 24 do not touch the core 22, the core insulator 26 is not necessary.

Embodiments of the magnetic sensor device 99 of the present invention can be operated by providing electrical power to the control circuit 42, for example an electronic circuit. The electronic control circuit 42 can control the magnetic sensors 30, the one or more inductors 20, or both by providing signals to and receiving signals from the magnetic sensor 30 and controlling the flow of electrical current through the one or more inductors 20, for example individually, together, or in separate groups of inductors 20. In embodiments of the present invention, the electronic control circuit 42 operates the magnetic sensor 30 to measure a magnetic field or to operate the one or more inductors 20 to provide a test magnetic field, or to operate the one or more inductors 20 to calibrate the magnetic sensors 30, or any combination of these functions. In an embodiment, the one or more inductors 20 provide a magnetic field at a magnetic sensor 30 location greater than or equal to 1 mT, 3 mT, 5 mT, 10 mT, 15 mT, 20 mT, or 50 mT.

Methods of forming micro-transfer printable structures are described, for example, in the paper *AMOLED Displays using Transfer-Printed Integrated Circuits* (Journal of the Society for Information Display, 2011, DOI #10.1889/JSID19.4.335, 1071-0922/11/1904-0335, pages 335-341) and U.S. Pat. No. 8,889,485, referenced above. For a discussion of micro-transfer printing techniques see, U.S. Pat. Nos. 8,722,458, 7,622,367 and 8,506,867, each of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled Compound Micro-Assembly Strategies and Devices, which is hereby incorporated by reference in its entirety. In an embodiment, the magnetic sensor device 99 is a compound micro-assembled device. Additional details useful in understanding and performing aspects of the present invention are described in U.S. patent application Ser. No. 14/743,981, filed Jun. 18, 2015, entitled Micro Assembled LED Displays and Lighting Elements, which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in" or "over."

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

The invention claimed is:

1. A magnetic sensor device, comprising:
a substrate having a surface;
a first magnetic sensor disposed at a first location on, over, or in direct contact with the surface, the first magnetic sensor being configured for detecting a magnetic field;
a second magnetic sensor disposed at a second location different from the first location on, over, or in direct contact with the surface, the second magnetic sensor being configured for detecting a magnetic field;
one or more inductors disposed over the substrate surface and located to provide a magnetic field to the first magnetic sensor and to the second magnetic sensor; and
a magnetic sensor controller having a control circuit for controlling the first magnetic sensor, the second magnetic sensor, and the one or more inductors;
wherein the control circuit includes circuitry adapted:
for controlling the first magnetic sensor to measure a first magnetic field and the one or more inductors to provide a fifth magnetic field;
for controlling the first magnetic sensor to measure a third magnetic field and the one or more inductors to provide a sixth magnetic field;
for controlling the second magnetic sensor to measure a second magnetic field and the one or more inductors to provide the fifth magnetic field;
for controlling the second magnetic sensor to measure a fourth magnetic field and the one or more inductors to provide the sixth magnetic field;
for calculating a relative sensitivity matching value that converts magnetic field values measured by the first magnetic sensor to a comparable magnetic field value measured by the second magnetic sensor or that converts magnetic field values measured by the second magnetic sensor to a comparable magnetic field value measured by the first magnetic sensor.

2. The magnetic sensor device of claim 1, wherein the inductor is a coil, a solenoid, or a straight conductor.

3. The magnetic sensor device of claim 1, wherein the fifth or the sixth magnetic field is zero, or wherein the fifth and sixth magnetic fields have an opposite polarity, or wherein the fifth and sixth magnetic fields have a common magnitude.

4. The magnetic sensor device of claim 1, wherein the control circuit includes circuitry adapted for controlling the first magnetic sensor to measure a first ambient magnetic field,
for controlling the second magnetic sensor to measure a second ambient magnetic field,
for correcting the ambient magnetic field measurement of the second magnetic sensor with the relative sensitivity matching value to form a corrected measurement, and
for combining the ambient magnetic field measurement by the first magnetic sensor and the corrected ambient magnetic field measurement to form a magnetic field measurement.

5. The magnetic sensor device of claim 4, wherein the control circuit includes circuitry adapted for controlling the first magnetic sensor to measure the ambient magnetic field at the same time that the circuitry controls the second magnetic sensor to measure the ambient magnetic field.

6. The magnetic sensor device of claim 3, wherein the control circuit includes circuitry adapted for controlling the one or more inductors to provide a magnetic field having a forward polarity and for controlling the first magnetic sensor to measure the ambient magnetic field including the forward polarity magnetic field,
for controlling the one or more inductors to provide a magnetic field having a reverse polarity and for controlling the first magnetic sensor to measure the ambient magnetic field including the reverse polarity magnetic field, and
for then calculating the ambient magnetic field excluding any field provided by the one or more inductors by combining the two measurements.

7. The magnetic sensor device of claim 1, wherein the control circuit includes circuitry adapted for controlling the one or more inductors to provide a magnetic field having a forward polarity and for controlling the first magnetic sensor to measure the ambient magnetic field including the forward polarity magnetic field,
for controlling the one or more inductors to provide a magnetic field having a reverse polarity and for controlling the second magnetic sensor to measure the ambient magnetic field including the reverse polarity magnetic field,
for correcting the measurement by the second magnetic sensor using the relative sensitivity matching value to produce a corrected measurement, and
for then calculating the ambient magnetic field excluding any field provided by the one or more inductors by combining the measurement by the first magnetic sensor and the corrected measurement.

8. The magnetic sensor device of claim 1, wherein the control circuit includes circuitry adapted for controlling the first magnetic sensor to measure the ambient magnetic field and for controlling the second magnetic sensor to measure the ambient magnetic field,
for correcting the measurement by the second magnetic sensor using the relative sensitivity matching value to produce a corrected measurement, and
for calculating a magnetic field gradient by combining the measurement by the first magnetic sensor and the corrected measurement.

9. The magnetic sensor device of claim 1, wherein the relative sensitivity matching value includes or is a multiplication or division factor,
wherein the relative sensitivity matching value includes or is an additive or subtractive offset factor, or
wherein the relative sensitivity matching value includes both a multiplication or division factor and an additive or subtractive offset factor.

10. A method of matching multiple magnetic sensors in a magnetic sensor device, comprising:
providing a substrate having a surface, a first magnetic sensor disposed at a first location on, over, or in direct contact with the surface, a second magnetic sensor disposed at a second location on, over, or in direct contact with the surface, the first magnetic sensor and the second magnetic sensor both being adapted for detecting a magnetic field and the first location different from the second location, one or more inductors disposed over the substrate surface and located to provide a magnetic field to the first magnetic sensor and to the second magnetic sensor; and controlling the first magnetic sensor to measure a first magnetic field and the one or more inductors to provide a fifth magnetic field;

controlling the first magnetic sensor to measure a third magnetic field and the one or more inductors to provide a sixth magnetic field;

controlling the second magnetic sensor to measure a second magnetic field and the one or more inductors to provide the fifth magnetic field;

controlling the second magnetic sensor to measure a fourth magnetic field and the one or more inductors to provide the sixth magnetic field; and calculating a relative sensitivity matching value that converts magnetic field values measured by the first magnetic sensor to a comparable magnetic field value measured by the second magnetic sensor or that converts magnetic field values measured by the second magnetic sensor to a comparable magnetic field value measured by the first magnetic sensor.

11. The method of claim 10, comprising:

controlling the first magnetic sensor to measure a first ambient magnetic field, controlling the second magnetic sensor to measure a second ambient magnetic field, correcting the ambient magnetic field measurement by the second magnetic sensor with the relative sensitivity matching value to produce a corrected ambient magnetic field measurement, and combining the corrected ambient magnetic field measurement and the ambient magnetic field measurement by the first magnetic sensor to form a magnetic field measurement.

12. The method of claim 11, wherein measuring the first ambient magnetic field and measuring the second ambient magnetic field are carried out at the same time.

13. The method of claim 10, comprising:

controlling the one or more inductors to provide the fifth magnetic field having a forward polarity and controlling the first magnetic sensor to measure the ambient magnetic field including the forward polarity magnetic field, controlling the one or more inductors to provide the sixth magnetic field having a reverse polarity and controlling the first magnetic sensor to measure the ambient magnetic field including the reverse polarity magnetic field, and then calculating the ambient magnetic field excluding any field provided by the one or more inductors by combining the two measurements.

14. The method of claim 10, comprising:

controlling the one or more inductors to provide the fifth magnetic field having a forward polarity and controlling the first magnetic sensor to measure the ambient magnetic field including the forward polarity magnetic field, controlling the one or more inductors to provide the sixth magnetic field having a reverse polarity and controlling the first magnetic sensor to measure the ambient magnetic field including the reverse polarity magnetic field, correcting the measurement by the second magnetic sensor with the relative sensitivity matching value to produce a corrected measurement, and then calculating the ambient magnetic field excluding any field provided by the one or more inductors by combining the measurement by the first magnetic sensor and the corrected measurement.

15. The method of claim 10, wherein the relative sensitivity matching value includes or is a multiplication or division factor, wherein the relative sensitivity matching value includes or is an additive or subtractive offset factor, or wherein the relative sensitivity matching value includes both a multiplication or a division factor and an additive or subtractive offset factor.

* * * * *